US012615768B2

(12) United States Patent
Chen et al.

(10) Patent No.: US 12,615,768 B2
(45) Date of Patent: Apr. 28, 2026

(54) ONE-TIME-PROGRAMMABLE MEMORY DEVICE

(71) Applicant: eMemory Technology Inc., Hsinchu (TW)

(72) Inventors: Lun-Chun Chen, Zhubei City (TW); Ping-Lung Ho, Zhubei City (TW)

(73) Assignee: eMEMORY TECHNOLOGY INC., Hsinchu (TW)

( * ) Notice: Subject to any disclaimer, the term of this patent is extended or adjusted under 35 U.S.C. 154(b) by 124 days.

(21) Appl. No.: 18/665,740

(22) Filed: May 16, 2024

(65) Prior Publication Data

US 2024/0397710 A1 Nov. 28, 2024

Related U.S. Application Data

(60) Provisional application No. 63/468,561, filed on May 24, 2023.

(51) Int. Cl.
*G11C 17/18* (2006.01)
*G11C 16/10* (2006.01)
(Continued)

(52) U.S. Cl.
CPC ............. *H10B 20/25* (2023.02); *G11C 16/10* (2013.01); *G11C 16/26* (2013.01);
(Continued)

(58) Field of Classification Search
CPC ........ H10B 20/25; H10B 41/35; H10B 43/35; G11C 16/10; G11C 16/26; G11C 16/3427;
(Continued)

(56) References Cited

U.S. PATENT DOCUMENTS 6,137,318 A 10/2000 Takaaki
7,242,063 B1 7/2007 Chow et al.
(Continued)

FOREIGN PATENT DOCUMENTS

| EP | 3 196 888 A1 | 7/2017 |
| TW | 201225094 A1 | 6/2012 |
| WO | WO 2014/066997 A1 | 5/2014 |

*Primary Examiner* — Jerome Leboeuf

(74) *Attorney, Agent, or Firm* — Birch, Stewart, Kolasch & Birch, LLP

(57) ABSTRACT

A one-time-programmable (OTP) memory device includes a memory array including an N-type memory cell and a P-type memory cell. The N-type memory cell includes first channel layers and second channel layers. The P-type memory cell includes third channel layers and fourth channel layers. The N-type memory cell and the P-type memory cell further include a first word-line gate structure extending in the Y-direction and wrapping around the first channel layers and the third channel layers, and an anti-fuse gate structure extending in the Y-direction and wrapping around the second channel layers and the fourth channel layers. The OTP memory device further includes a wall structure extending in an X-direction and between the N-type memory cell and the P-type memory cell in the Y-direction. The first channel layers, the second channel layers, the third channel layers, and the fourth channel layers attach on the wall structure.

13 Claims, 8 Drawing Sheets

(51) Int. Cl.
G11C 16/26 (2006.01)
G11C 16/34 (2006.01)
G11C 17/16 (2006.01)
H10B 20/25 (2023.01)
H10B 41/35 (2023.01)
H10B 43/35 (2023.01)

(52) U.S. Cl.
CPC .......... G11C 16/3427 (2013.01); G11C 17/16 (2013.01); G11C 17/18 (2013.01); H10B 41/35 (2023.02); H10B 43/35 (2023.02)

(58) Field of Classification Search
CPC ......... G11C 17/16; G11C 17/18; G11C 16/34; H10D 30/696; G06F 3/0688
See application file for complete search history.

(56) References Cited

U.S. PATENT DOCUMENTS

2020/0365607 A1 * 11/2020 Cheng ................. H10D 30/477
2021/0407999 A1   12/2021 Huang et al.
2022/0028899 A1 *  1/2022 Chen ...................... H10D 30/43
2022/0359545 A1 * 11/2022 Chang ................. H10D 64/017
2025/0234529 A1 *  7/2025 Horch ................... H10B 20/25

* cited by examiner

ONE-TIME-PROGRAMMABLE MEMORY DEVICE

CROSS REFERENCE TO RELATED APPLICATIONS

This application claims the benefit of U.S. Provisional Application No. 63/468,561, filed on May 24, 2023, the entirety of which is incorporated by reference herein.

BACKGROUND OF THE INVENTION

Field of the Invention

The present invention relates to a one-time-programmable (OTP) memory device, and, in particular, to an OTP memory device including an OTP memory array with one or more secure OTP memory cell.

Description of the Related Art

The one-time-programmable (OTP) memory device has been developed. The OTP memory device is a one time programmable non-volatile memory that can be programmed once. After the OTP memory cell in the OTP memory device is programmed, the storage state of the OTP memory cell is determined and the storage state of the OTP memory cell fails to be modified. Therefore, the OTP memory device is generally used for security applications, such as secure key storage, device IDs, and code storage.

One type of the OTP memory device is anti-fuse type. The anti-fuse type OTP memory cell in the OTP memory device has a high-impedance storage state before being programmed and has a low-impedance storage state after being programmed.

However, although existing technologies for anti-fuse OTP memory device have been generally adequate for their intended purposes, they have not been entirely satisfactory in all respects.

BRIEF SUMMARY OF THE INVENTION

The present disclosure provides a one-time-programmable (OTP) memory device. The OTP memory device includes a memory array including an N-type memory cell in a first row and a P-type memory cell in a second row adjacent to the first row in a Y-direction. The N-type memory cell includes first channel layers spaced apart from each other in a Z-direction and second channel layers spaced apart from each other in the Z-direction. The P-type memory cell includes third channel layers spaced apart from each other in a Z-direction and fourth channel layers spaced apart from each other in the Z-direction. The N-type memory cell and the P-type memory cell further include a first word-line gate structure extending in the Y-direction and wrapping around the first channel layers and the third channel layers, and an anti-fuse gate structure extending in the Y-direction and wrapping around the second channel layers and the fourth channel layers. The OTP memory device further includes a wall structure extending in an X-direction and between the N-type memory cell and the P-type memory cell in the Y-direction. The first channel layers, the second channel layers, the third channel layers, and the fourth channel layers attach on the wall structure.

The present disclosure provides a one-time-programmable (OTP) memory device. The OTP memory device includes a memory array including an N-type memory cell and a P-type memory cell. The N-type memory cell is in a first row and has a first active area extending in an X-direction. The P-type memory cell is in a second row and has a second active area extending in the X-direction. The OTP memory device further includes a wall structure, and the N-type memory cell and the P-type memory cell further includes an anti-fuse gate structure, and a first word-line gate structure and a second word-line gate structure. The wall structure extends in the X-direction. The first active area and the second active area are disposed on opposite sides of the wall structure. The anti-fuse gate structure extends in the Y-direction and engages the first active area and the second active area. The first word-line gate structure and the second word-line gate structure extend in the Y-direction and engage the first active area and the second active area. The first word-line gate structure and the second word-line gate structure are disposed on opposite sides of the anti-fuse gate structure. The first word-line gate structure is electrically connected to the second word-line gate structure.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only exemplary aspects of the disclosure and are not therefore to be considered to be limiting of its scope, the principles herein are described and explained with additional specificity and detail through the use of the accompanying drawings.

DETAILED DESCRIPTION OF THE INVENTION

Figure 1A:
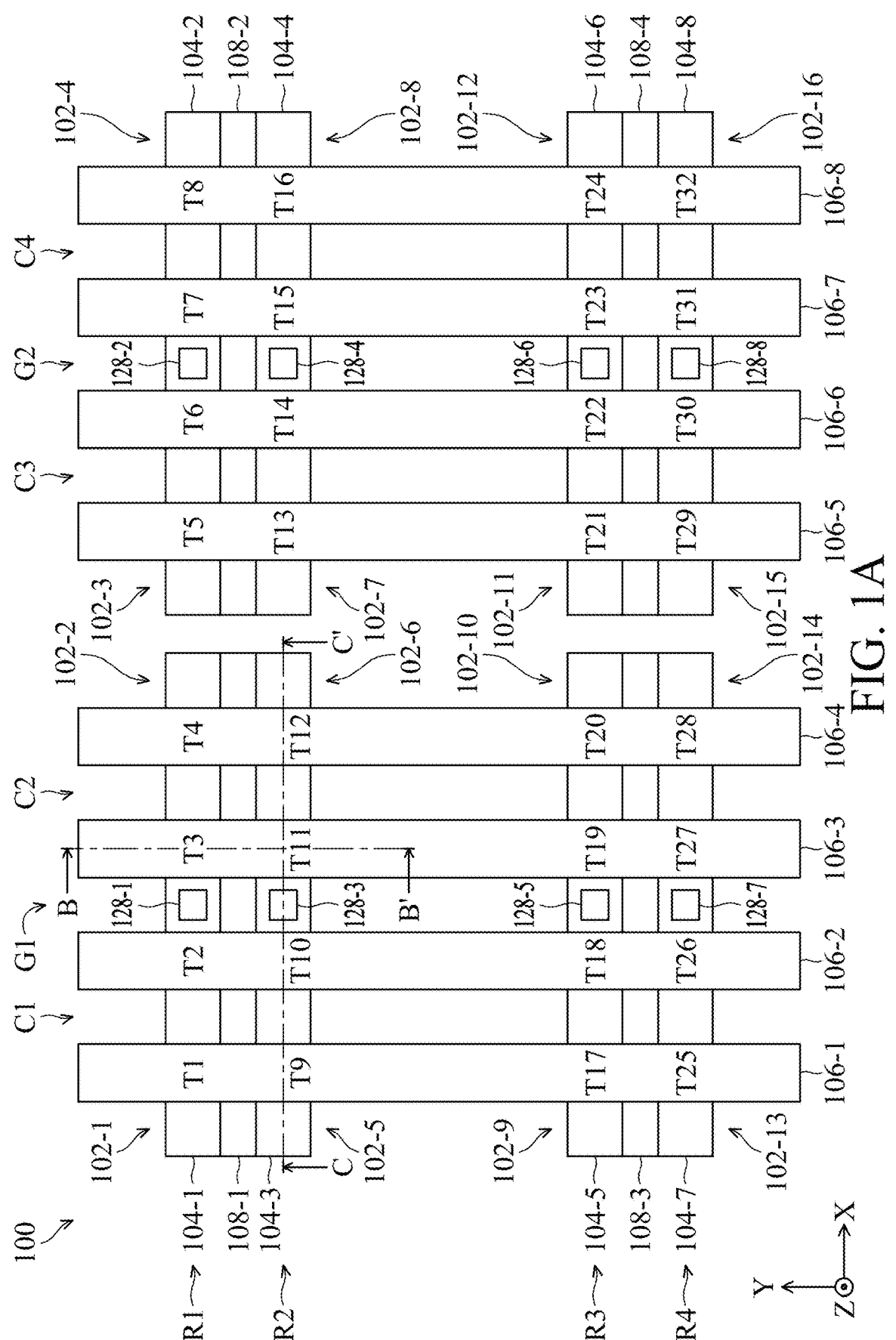
FIG. 1A illustrates a top view (or a layout) of an OTP memory array of OTP memory cells in an OTP memory device, in portion or entirety, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise indicated.

Figure 1B:
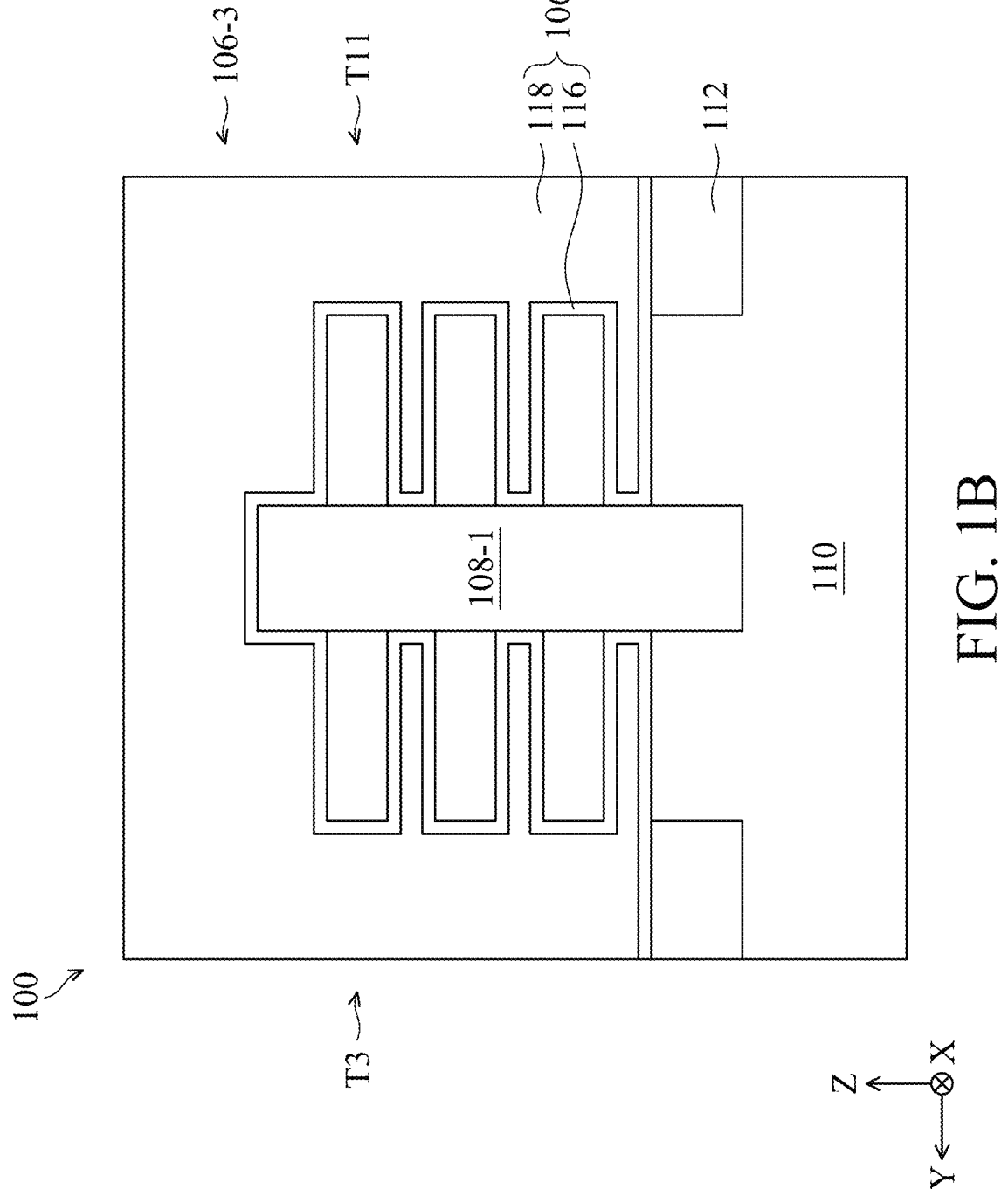
FIG. 1B illustrates a Y-Z cross-sectional view of the OTP memory array of the of OTP memory cells along a line B-B' of FIG. 1A, in accordance with some embodiments of the present disclosure.
Figure 1C:
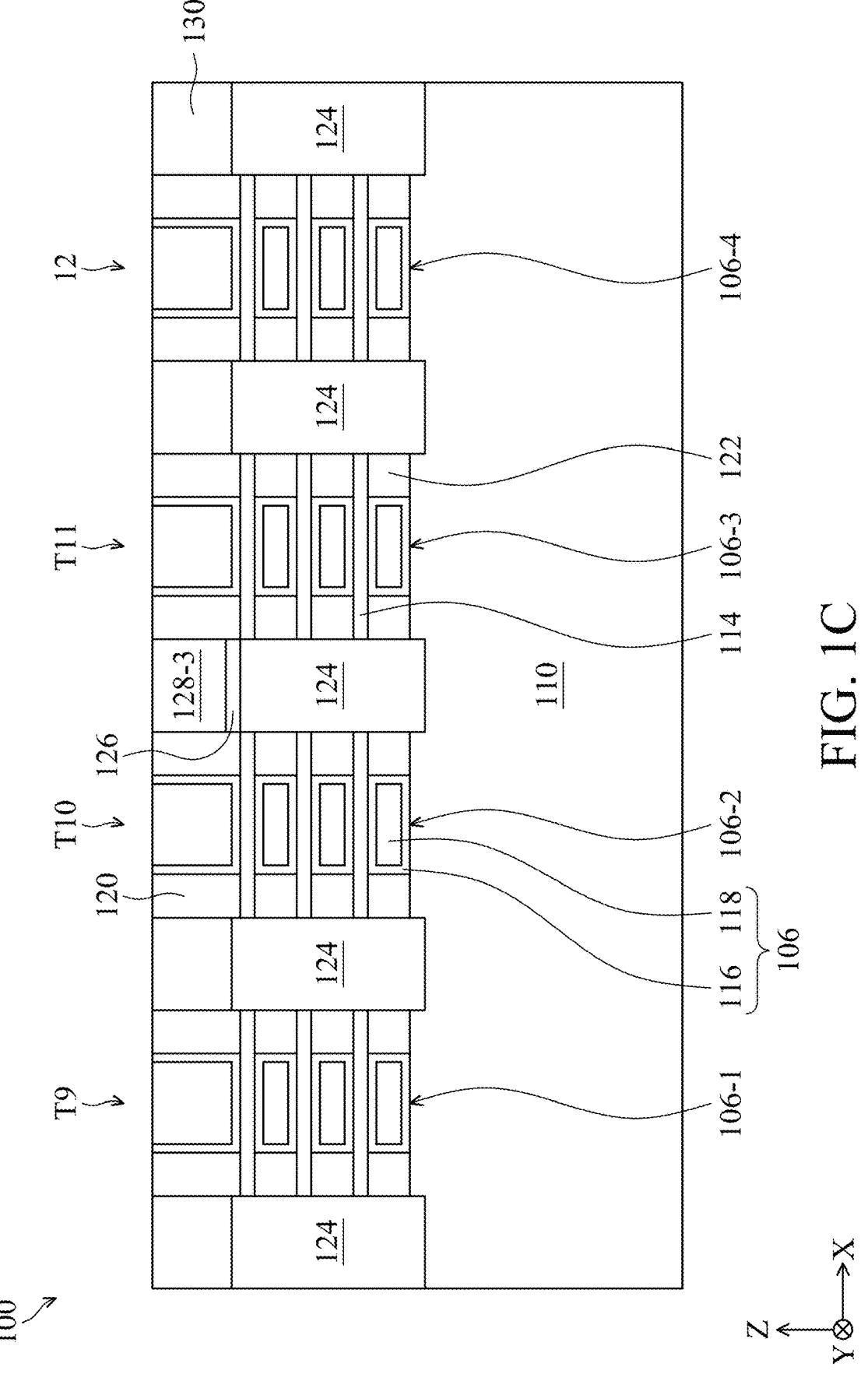
FIG. 1C illustrates an X-Z cross-sectional view of the OTP memory array of the of OTP memory cells along a line C-C' of FIG. 1A, in accordance with some embodiments of the present disclosure.

FIG. 1A illustrates a top view (or a layout) of an OTP memory array 100 of OTP memory cells 102 in an OTP memory device, in portion or entirety, in accordance with some embodiments of the present disclosure. FIG. 1B illustrates a Y-Z cross-sectional view of the OTP memory array 100 of the of OTP memory cells 102 along a line B-B' of FIG. 1A, in accordance with some embodiments of the present disclosure. FIG. 1B also shows a basic structure of a forksheet FET. FIG. 1C illustrates an X-Z cross-sectional view of the OTP memory array 100 of the of OTP memory cells 102 along a line C-C' of FIG. 1A, in accordance with some embodiments of the present disclosure.

The OTP memory array 100 shown in FIGS. 1A to 1C includes the OTP memory cells 102 (including the OTP memory cells 102-1 to 102-16) arranged in rows and columns. More specifically, the OTP memory cells 102-1 to 102-16 are arranged in four rows R1 to R4 and four columns C1 to C4. Therefore, as shown in FIG. 1A, the OTP memory array 100 is a 4×4 array, in accordance with some embodiments. It should be noted that the OTP memory array 100 may have more OTP memory cells arranged in more rows and more columns. The OTP memory array 100 may be a portion of entire OTP memory array, in accordance with some embodiments.

The OTP memory array 100 includes active areas, such as active areas 104-1 to 104-8, (may be collectively referred to as active areas 104) that extend lengthwise in the X-direction. Each of active areas 104 includes channel regions, source regions, and drain regions (where source regions and drain regions are collectively referred to as source/drain regions herein) of transistors of the OTP memory array 100. In some embodiments, each of the active areas 104-1 to 104-8 are disposed over an N-type well (or N-Well) or a P-type well (or P-Well).

As shown in FIG. 1A, each of the OTP memory cells 102 has one of the active areas 104-1 to 104-8. For example, the OTP memory cells 102-2 has the active area 104-1. Furthermore, the adjacent two OTP memory cells 102 (that are respectively in adjacent two columns of the OTP memory array 100) in the X-direction share one active area 104. For example, the OTP memory cells 102-1 and 102-2 share the active area 104-1.

Furthermore, each odd column is grouped and abutted with one even column. As shown in FIG. 1A, the OTP memory cells 102 in the column C1 and C2 are grouped and abutted with each other into a group G1, and the OTP memory cells 102 in the column C3 and C4 are grouped and abutted with each other into a group G2. The group G1 is separated from the group G2. As such, the OTP memory cells 102 in different groups are also separated from each other. For example, the OTP memory cell 102-2 is separated from the OTP memory cell 102-3. In some embodiments, active areas 104 in different groups are also separated from each other. For example, the active areas 104-1 in the group G1 is separated from the active areas 104-2 in the group G2.

The OTP memory array 100 further includes gate structures, such as gate structures 106-1 to 106-8 (may be collectively referred to as gate structures 106). The gate structures 106-1 to 106-8 extend substantially parallel to one another, extend lengthwise in the Y-direction perpendicular to the X-direction, and are separated from each other in the X-direction, as shown in FIG. 1A. The gate structures 106-1 to 106-8 are disposed over the channel regions of the respective active areas 104-1 to 104-8 (i.e., the (vertically stacked) channel layers 114 shown in FIGS. 1B and 1C) and disposed between respective source/drain regions of the active areas 104-1 to 104-8 (i.e., source/drain features 124 shown in FIG. 1C). In some embodiments, gate structures 106-1 to 106-8 wrap and/or surround suspended, vertically stacked channel layers 114 in the channel regions of the active areas 104-1 to 104-8, respectively (as shown in FIGS. 1B and 1C).

The active areas 104-1 to 104-8 and the gate structures 106-1 to 106-8 are configured to provide each of the OTP memory cell 102-1 to 102-16 with transistors. For example, in the OTP memory cells 102-2, the gate structure 106-3 engages the active area 104-1 to construct a transistor T3 and the gate structure 106-4 engages the active area 104-1 to construct a transistor T4. More specifically, the gate structures 106-1 to 106-8 respectively engages the active areas 104-1 to 104-8 to construct transistors T1 to T32, as shown in FIG. 1A. Further, as shown in FIG. 1A, each of the OTP memory cells 102-1 to 102-16 includes two transistors, in accordance with some embodiments.

Furthermore, the transistors in the same column share the same gate structures 106. For example, the transistors T3, T11, T19, and T27 share the gate structure 106-3, and the transistors T4, T12, T20, and T28 share the gate structure 106-4, as shown in FIG. 1A. In some aspects, the transistors T3, T11, T19, and T27 include the gate structure 106-3, and the transistors T4, T12, T20, and T28 include the gate structure 106-4.

Referring to FIGS. 1A to 1C, the OTP memory array 100 includes a substrate 110, over which the various features are formed, such as the gate structures 106. The substrate 110 may contains a semiconductor material, such as bulk silicon (Si). In some other embodiments, the substrate 110 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 110 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

The OTP memory array 100 further includes an isolation feature (or isolation structure) 112 over the substrate 110 and isolating the adjacent active areas 104. The isolation feature 112 may include silicon oxide, silicon nitride, silicon oxynitride, other suitable isolation material (for example, including silicon, oxygen, nitrogen, carbon, or other suitable isolation constituent), or a combination thereof. The isolation feature 112 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIG. 1A, each of the OTP memory cells 102 includes two transistors. For example, the OTP memory cell 102-2 includes the transistors T3 and T4, and the OTP memory cell 102-6 includes the transistors T11 and T12. Furthermore, each of the OTP memory cells 102 includes the channel layers 114 for the two transistors. As shown in FIGS. 1B and 1C, the channel layers 114 are suspended over the substrate 110. In some embodiments, three channel layers 114 are vertically stacked (or vertically arranged) from each other in the Z-direction for each of the transistors T1 to T32. However, there may be another appropriate number of nanostructures in one transistor. For example, there may be from 2 to 10 channel layers 114 in one transistor. The channel layers 114 further extend lengthwise in the X-direction (FIG. 1C) and widthwise in the Y-direction (FIG. 1B).

The channel layers 114 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the channel layers 114 include silicon for N-type transistors. In other embodiments, the channel layers 114 include silicon germanium for P-type transistors. In some embodiments, the channel layers 114 are all made of silicon, and the type of the transistors depend on work function metal layer wrapping around the channel layers 114. In some embodiments, the channel layers 114 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

Referring to FIGS. 1A and 1B, the OTP memory array 100 further includes wall structures 108, such as wall structures 108-1 to 108-4, (may be collectively referred to as wall structures 108) that extend lengthwise in the X-direction (e.g., parallel to the active areas 104). As shown in FIG. 1A, the active areas 104 interface the wall structures 108. More specifically, the adjacent two active areas 104 in the Y-direction are on the opposite sides of the wall structure 108 in the Y-direction. For example, the active areas 104-1 and 104-3 are on the opposite sides of the wall structure 108-1 in the Y-direction. In some aspects, the wall structures 108 are between the adjacent active areas 104 in the Y-direction. For example, the wall structure 108-1 is between the adjacent active areas 104-1 and 104-3 in the Y-direction, as shown in FIG. 1A.

As shown in FIG. 1B, in each of the transistors T1 to T32, three channel layers 114 are spaced apart from each other in the Z-direction and attached on the wall structures 108 in the Y-direction. More specifically, each of the wall structures 108 may be in contact with (sidewalls of) the channel layers 114 in the adjacent rows of the OTP memory array 100. In other words, the channel layers 114 are in contact with sidewalls of the wall structures 108 in the Y-direction. In some aspects, the channel layers 114 are on opposite sides of the wall structures 108 in the Y-direction. Therefore, the channel layers 114 and the wall structures 108 construct fork sheet structures.

The wall structures 108 are also formed over the substrate 110 and the isolation feature 112, as shown in FIG. 1B. As shown in FIG. 1B, the wall structures 108 extend vertically in the Z-direction. Furthermore, the sidewalls of the wall structures 108 are in contact with the substrate 110, and bottom surfaces of the wall structures 108 are in contact with the isolation feature 112. The wall structures 108 are also between and in contact with (sidewalls of) the gate structures 106 in the Y-direction, as shown in FIG. 1B The material of the wall structures 108 may be single dielectric layer or multiple layers and selected from a group consisting of $Si_3N_4$, oxide, SiOC, SiON, SiOCN, carbon content oxide, nitrogen content oxide, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide, high K material (K>=9), or combinations thereof.

As discussed above, the gate structures 106 engage the active areas 104 to construct the transistors T1 to T32. More specifically, the gate structures 106-1 to 106-8 wrap around the channel layers 114 in the channel regions of the active areas 104-1 to 104-8. For example, the gate structure 106-3 wraps around the channel layers 114 in the channel regions of the active areas 104-1 and 104-3, as shown in FIGS. 1A and 1B. Each of the gate structures 106-1 to 106-8 has a gate dielectric layer 116 and a gate electrode layer 118. The gate dielectric layers 116 wrap around each of the channel layers 114 and the gate electrode layers 118 wrap around the gate dielectric layer 116. In some embodiments, each of the gate structures 106 further includes an interfacial layer (such as having silicon dioxide, silicon oxynitride, or other suitable materials) between the gate dielectric layer 116 and the channel layers 114. The gate dielectric layers 116 may include oxide with nitrogen doped dielectric material (initial layer) combined with metal content high-K dielectric material (K value (dielectric constant)>13). For example, gate dielectric layers 116 may include hafnium oxide ($HfO_2$), which has a dielectric constant in a range from about 18 to about 40. Alternatively, the gate dielectric layers 116 may include other high-K dielectrics, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfLaO, HfSiO, LaSiO, AlSiO, HfTaO, HfTiO, (Ba,Sr)TiO3 (BST), Al2O3, Si3N4, oxynitrides (SiON), combinations thereof, or other suitable material. The gate dielectric layers 116 may be formed by chemical oxidation, thermal oxidation, ALD, CVD, and/or other suitable methods.

The gate electrode layer 118 is formed to wrap around the gate dielectric layer 116 and the center portions of the channel layers 114, as shown in FIG. 1B. In some embodiments, the gate electrode layer 118 may include an N-type work function metal layer for N-type transistor or a P-type work function metal layer for P-type transistor wrapping around the channel layers 114. The material of the N-type work function metal layer and the P-type work function metal layer may be the same. In some embodiments, the material of the N-type work function metal layer and the P-type work function metal layer are different.

In some embodiments, the N-type work function metal layer is a material such as Ti, Al, Ag, Mn, Zr, TiAl, TiAlC, TaC, TaCN, TaSiN, TaAl, TaAlC, TiAlN, other suitable N-type work function materials, or combinations thereof. For example, the N-type work function metal layer may be deposited utilizing ALD, CVD, or the like. However, any suitable materials and processes may be utilized to form the N-type work function metal layer. In some embodiments, the P-type work function metal layer is a material such as TiN, TaN, Ru, Mo, Al, WN, ZrSi2, MoSi2, TaSi2, NiSi2, other metal oxides, metal nitrides, metal silicates, transition metal-oxides, transition metal-nitrides, transition metal-silicates, oxynitrides of metals, metal aluminates, zirconium silicate, zirconium aluminate, other suitable P-type work function materials, combinations of these, or the like. Additionally, the P-type work function metal layer may be deposited using a deposition process such as ALD, CVD, or the like, although any suitable deposition process may be used.

In some embodiments, the gate electrode layer 118 may include a single layer or alternatively a multi-layer structure. In some embodiments, the gate electrode layer 118 may further include a capping layer, a barrier layer, and a fill material (not shown). The capping layer may be formed adjacent to the gate dielectric layers 116 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a different material than the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The OTP memory array 100 further includes gate spacers 120 on sidewalls (or opposite sides) of the gate structures 106 in the X-direction, and over the channel layers 114 in the Z-direction, as shown in FIG. 1C. The gate spacers 120 are over the channel layers 114 and on top sidewalls of the gate structures 106, and thus are also referred to as gate top spacers or the top spacers. The gate spacers 120 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 120 may include a single layer or a multi-layer structure.

As shown in FIG. 1C, the OTP memory array 100 further includes inner spacers 122 on the sidewalls (or opposite sides) of the gate structures 106 in the X-direction, and below the topmost channel layers 114 in the Z-direction. Furthermore, the inner spacers 122 are laterally between the source/drain features 124 and the gate structures 106. The inner spacers 122 are also vertically between adjacent channel layers 114 and between bottommost channel layers 114 and the substrate 110. The inner spacers 122 may include a dielectric material having higher K value (dielectric constant) than the gate spacers 120 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof.

Referring to FIGS. 1C, the OTP memory array 100 further includes source/drain features 124 over the substrate 110 and in the source/drain regions of the active areas 104. More specifically, the source/drain features 124 are respectively disposed between the two respective gate structures 106. As shown in FIG. 1C, the source/drain features 124 are disposed on opposite sides of the respective gate structure 106 in the X-direction to form transistor (e.g., the transistors T1 to T32).

The channel layers 114 extend in the X-direction to connect one source/drain feature 124 to the other source/drain feature 124, as shown in FIG. 1C. More specifically, the source/drain features 124 are also disposed on opposite sides of the respective channel layers 114 in the X-direction. Therefore, the source/drain features 124 are attached and electrically connected to the channel layers 114 in the X-direction. Furthermore, every two adjacent transistors in the X-direction share one source/drain feature 124, as shown in FIG. 1C. The source/drain features 124 may also be referred to as source/drain, or source/drain regions. In some embodiments, source/drain feature(s) may refer to a source or a drain, individually or collectively dependent upon the context.

The source/drain features 124 may be formed by using epitaxial growth. In some embodiments, the source/drain features 124 may include epitaxially-grown material selected from a group consisting of SiP, SiC, SiPC, SiAs, Si, or a combination thereof. In some embodiments, the epitaxially-grown material of the source/drain features 124 may be doped with N-type dopants, such as phosphorus, arsenic, other N-type dopant, or a combination thereof. In some embodiments, the source/drain features 124 doped with N-type dopants for N-type transistors may be respectively referred to as N-type features and N-type source/drain features.

In some embodiments, the source/drain features 124 may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 124 may be doped with P-type dopants, such as boron, indium, other P-type dopant, or a combination thereof. In some embodiments, the source/drain features 124 doped with P-type dopants for P-type transistors may be respectively referred to as P-type source/drain features.

Referring to FIGS. 1A to 1C, the OTP memory array 100 further includes source/drain contacts 128-1 to 128-8 (may be collectively referred to as source/drain contacts 128) on source/drain regions of the active areas 104, over and electrically connected to the source/drain features 124. The source/drain contacts 128 are self-aligned source/drain contacts. Therefore, the source/drain contacts 128 are in direct contact with the gate spacers 120, as shown in FIG. 1C. As shown in FIG. 1A, in the top view, the source/drain contacts 128 are between the gate structures 106 in the X-direction. Furthermore, each of the source/drain contacts 128 is shared by two OTP memory cells 102. For example, the source/drain contact 128-3 is shared by the OTP memory cells 102-5 and 102-6. As discussed above, each of the source/drain contacts 128 is over and electrically connected to the respective source/drain features 124. For example, as shown in FIGS. 1A and 1C, the source/drain contact 128-3 is over and electrically connected to the source/drain feature 124 shared by the transistors T10 and T11. The source/drain contacts 128 may each include a conductive material such as Al, Cu, W, Co, Ti, Ta, Ru, Rh, Ir, Pt, Mo, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 128 may each include single conductive material layer or multiple conductive layers.

Still referring to FIG. 1C, the OTP memory array 100 further includes silicide features 126 between and in contact with the source/drain features 124 and the source/drain contacts 128. In some embodiment, the silicide feature 126 is between the adjacent two gate structures 106 in the X-direction. The silicide features 126 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Referring to FIG. 1C, the OTP memory array 100 further includes an inter-layer dielectric (ILD) layer 130. The ILD layer 130 is over the substrate 110, over the source/drain features 124, and between the gate spacers 120. The ILD layer 130 include a dielectric material including, for example, silicon oxide, silicon nitride, silicon oxynitride, TEOS-formed oxide, PSG, BPSG, low-k dielectric material, other suitable dielectric material, or a combination thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or a combination thereof. In some embodiments, the ILD layer 130 is a dielectric layer that includes a low-k dielectric material (generally referred to as a low-k dielectric layer). The ILD layer 130 may include a multilayer structure having multiple dielectric materials.

Although not shown in FIGS. 1A to 1C, the source/drain contacts 128 in the same row of the OTP memory array 100 are electrically connected to a metal line serving as a bit-line (the metal line may be referred to as bit-line) in a inter metal dielectric (IMD) layer over the ILD layer 130. Therefore, in the present embodiments, the source/drain contacts 128-1 and 128-2 are electrically connected to the same metal line, the source/drain contacts 128-3 and 128-4 are electrically connected to the same metal line, the source/drain contacts 128-5 and 128-6 are electrically connected to the same metal line, and the source/drain contacts 128-7 and 128-8 are electrically connected to the same metal line.

In the present embodiments, the OTP memory array 100 is an anti-fuse OTP memory array. Each of the OTP memory cells 102-1 to 102-16 shown in FIGS. 1A to 1C is an anti-fuse OTP memory cell and has one transistor serving as access transistor and one serving as anti-fuse transistor. More specifically, as shown in FIGS. 1A, the transistors T2, T3, T6, T7, T10, T11, T14, T15, T18, T19, T22, T23, T26, T27, T30, and T31 serve as access transistors, and the transistors T1, T4, T5, T8, T9, T12, T13, T16, T17, T20, T21, T24, T25, T28, T29, and T32 serve as anti-fuse transistors.

The gate structures 106-2, 106-3, 106-6, and 106-7 for the transistors serving as access transistors are also serve as word-lines of the OTP memory cells 102. In some embodiments, the gate structures 106 serving as the word-lines are also referred to as word-line gate structures. The gate structures 106-1, 106-4, 106-5, and 106-8 for the transistors serving as anti-fuse transistors are also referred to as anti-fuse gate structures. Therefore, the gate structures 106 and the bit-lines (not shown, but the bit-lines electrically connected to the source/drain contacts 128 in the same rows, as discussed above) are selected to program/read the OTP memory cells 102. In some embodiments, each of the source/drain contacts 128 is adjacent to the gate structures 106 serving as the word-line gate structures. Furthermore, each of the source/drain contacts 128 is between adjacent two gate structures 106 serving as the word-line gate structures in adjacent two OTP memory cells 102 in the X-direction. Also, in some aspects, each of the source/drain contacts 128 is between adjacent two transistors serving as the access transistors in adjacent two OTP memory cells 102 in the X-direction.

When programming the OTP memory cells 102, a turn-on voltage is applied to the transistors serving as access transistors and a low voltage (zero or ground) is applied to the bit-line electrically connected to the source/drain contacts 128 to select the OTP memory cells 102, and a program voltage higher than the turn-on voltage is applied to the transistors serving as anti-fuse transistors. Therefore, the transistors serving as access transistors in the OTP memory cells 102 are turned on when the turn-on voltage discussed above is applied to them in the programming operation. Furthermore, the gate dielectric layers 116 of the transistors serving as anti-fuse transistors in the OTP memory cells 102 are ruptured after the programming operation, such that the gate dielectric layers 116 of the transistors serving as anti-fuse transistors are broken down to electrically short the gate structures 106 and the source/drain features 124. As such, the programmed OTP memory cells 102 are changed from a high-impedance storage state to low-impedance storage state.

Take the OTP memory cell 102-6 to be programmed as an example. In order to program the OTP memory cell 102-6, the gate structures 106-3 and 106-4 and the bit-line electrically connected to the source/drain contacts 128-3 and 128-4 are selected to select the OTP memory cells 102-6 in a programming operation. In the present embodiment, a voltage V1 (i.e., the turn-on voltage) is applied to the gate structure 106-3, a voltage V2 (i.e., the program voltage) is applied to the gate structure 106-4, and a zero or ground voltage is applied to the bit-line electrically connected to the source/drain contacts 128-3 and 128-4. In some embodiments, in the programming operation, the voltage V1 is in a range from about 0.4V to about 3V and the voltage V2 is in a range from about 3V to about 6V.

In the present embodiment, the gate structure 106-3 and the gate structure 106-4 are selected, but the bit-line electrically connected to the source/drain contacts 128-1 and 128-2, the bit-line electrically connected to the source/drain contacts 128-5 and 128-6, and the bit-line electrically connected to the source/drain contacts 128-7 and 128-8 are not selected. Therefore, the OTP memory cells 102-2, 102-10, and 102-14 in the same column C2 as the OTP memory cells 102-6 are not selected for programming. In the present embodiment, the voltage V1 is applied to the non-selected bit-lines, different to the zero or ground voltage applied to the selected bit-line discussed above.

In the present embodiment, the bit-line electrically connected to the source/drain contacts 128-3 and 128-4 is selected, but the gate structures 106-1, 106-2, 106-5, 106-6, 106-7, and 106-8 are not selected. Therefore, the OTP memory cells 102-5, 102-7, and 102-8 in the same row R2 as the OTP memory cells 102-6 are not selected for programming. In the present embodiment, the zero or ground voltage is applied to the non-selected gate structures 106, different to the voltages V1 and V2 applied to the selected gate structures 106 discussed above.

In the present embodiment, the other OTP memory cells 102 (e.g., the OTP memory cells 102-1, 102-3, 102-4, 102-9, 102-11, 102-12, 102-13, 102-15, and 102-16) in different columns and rows than the OTP memory cells 102-6 are not selected for programming. The bit-line electrically connected to the source/drain contacts 128-1 and 128-2, the bit-line electrically connected to the source/drain contacts 128-5 and 128-6, and the bit-line electrically connected to the source/drain contacts 128-7 and 128-8 are not selected; and the gate structures 106-1, 106-2, 106-5, 106-6, 106-7, and 106-8 are not selected. In the present embodiment, the voltage V1 is applied to the non-selected bit-lines and the zero or ground voltage is applied to the non-selected gate structures 106.

Reading the OTP memory cells 102 is similar to programming the OTP memory cells 102, except that the voltage ranges applied to the gate structures and the bit-lines are different to the voltage ranges discussed above in a reading operation. More specifically, when reading the OTP memory cells 102, the turn-on voltage is applied to the transistors serving as access transistors and the low voltage (zero or ground) is applied to the bit-line electrically connected to the source/drain contacts 128 to select the OTP memory cells 102, and a read voltage is applied to the transistors serving as anti-fuse transistors to read the OTP memory cells 102. In some embodiments, in the reading operation, the voltage V1 (the turn-on voltage) is in a range from about 0.4V to about 1.6V and the voltage V2 (the read voltage) is in a range from about 0.4V to about 1.6V.

Conventionally, the OTP memory cells in the OTP memory array are all N-ype OTP memory cells. More specifically, the transistors in the OTP memory cells are all N-type transistors in convention. In the present embodiments, one or more OTP memory cells 102 are configured as P-type OTP memory cells for security. These P-type OTP memory cells may be referred to as secure OTP memory cells.

When programming these P-type OTP memory cells using the way as the example discussed above in the programming operation, these P-type OTP memory cells are not programmed and remain in their original storage state (high-impedance storage state). This is because transistors (the access transistors and the anti-fuse transistors) in these P-type OTP memory cells are P-type transistors. The transistors serving as access transistors in the P-type memory cells are turned off when the turn-on voltage discussed above is applied to them in the programming operation. Furthermore, the gate dielectric layers 116 of the transistors serving as anti-fuse transistors in the P-type OTP memory cells is not ruptured after the programming operation. As such, reverse engineering to crack the OTP memory array with these P-type OTP memory cells can be prevented.

Therefore, when reading the programmed P-type OTP memory cells and the programmed N-type OTP memory cells using the way as the example discussed above in the reading operation, the reading current of the programmed N-type OTP memory cells is greater than the reading current of the programmed P-type OTP memory cells due to the programmed N-type OTP memory cells are in low-impedance storage state and the programmed P-type OTP memory cells are still in high-impedance storage state after the programming operation.

For the OTP memory cells 102 configured as P-type OTP memory cells, the source/drain features 124 in these OTP memory cells 102 are configured as P-type source/drain features. Therefore, these source/drain features 124 are doped with P-type dopants, such as boron, indium, other P-type dopant, or a combination thereof. Furthermore, in some embodiments, the gate electrode layer 118 of the gate structures 106 for these OTP memory cells 102 may include the P-type work function metal layer discussed above. Therefore, the gate electrode layer 118 of the gate structures 106 may include the N-type work function metal layer(s) for the N-type OTP memory cells and the P-type work function metal layer(s) for the P-type OTP memory cells, in accordance with some embodiments.

In some embodiments, in the OTP memory array 100 shown in FIGS. 1A to 1C, some random OTP memory cells 102 are configured as P-type OTP memory cells, and the other OTP memory cells 102 are configured as N-type OTP memory cells. For example, the OTP memory cells 102-6, 102-7, 102-10, 102-11, 102-13, and 102-15 are configured as P-type OTP memory cells, and the other OTP memory cells 102 are configured as N-type OTP memory cells.

In some embodiments, in the OTP memory array 100 shown in FIGS. 1A to 1C, some OTP memory cells 102 in the same rows are configured as P-type OTP memory cells, and the other OTP memory cells 102 are configured as N-type OTP memory cells. For example, the OTP memory cells 102-5, 102-6, 102-7, 102-8 in the same row R2 and/or the OTP memory cells 102-13, 102-14, 102-15, 102-16 in the same row R4 are configured as P-type OTP memory cells, and the other OTP memory cells 102 are configured as N-type OTP memory cells.

In some embodiments, in the OTP memory array 100 shown in FIGS. 1A to 1C, the P-type OTP memory cells and the N-type OTP memory cells are arranged in a checkerboard pattern. For example, the OTP memory cells 102-1, 102-3, 102-6, 102-8, 102-9, 102-11, 102-14, and 102-16 are configured as P-type OTP memory cells, and the other OTP memory cells 102 are configured as N-type OTP memory cells.

Figure 2:
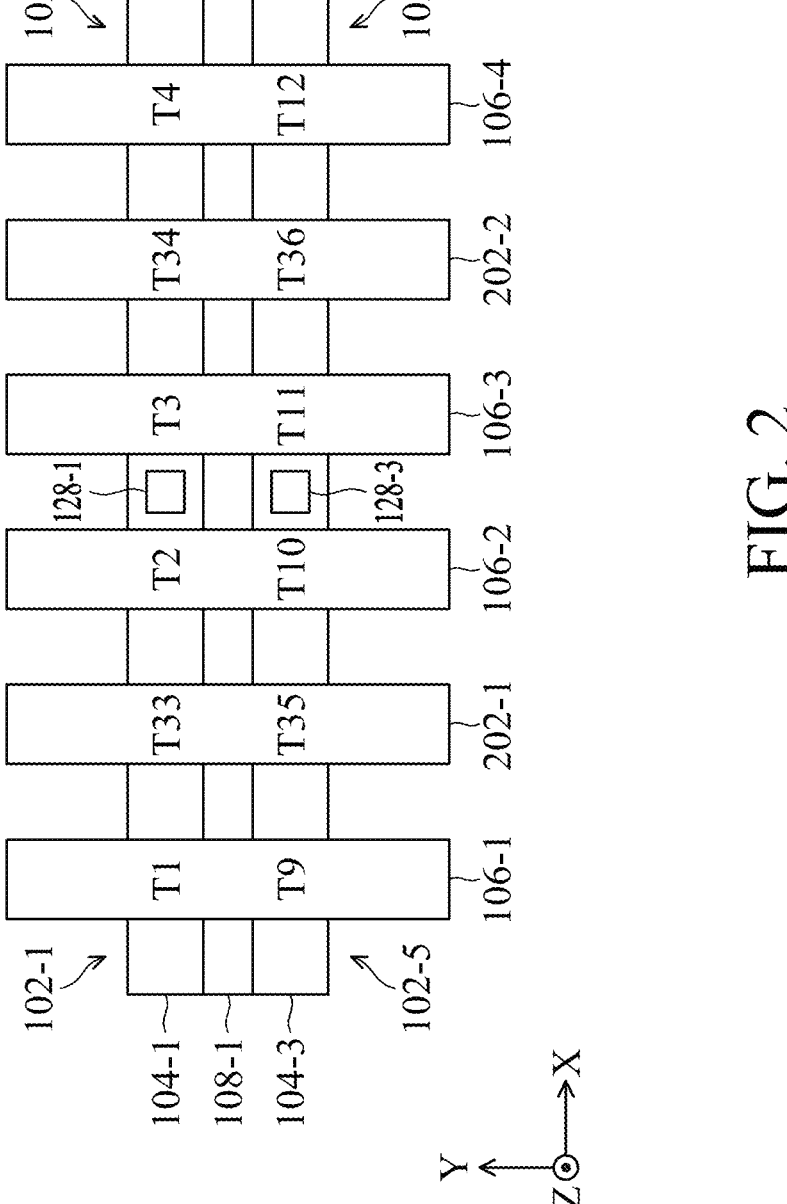
FIG. 2 illustrates a top view (or a layout) of OTP memory cells in the OTP memory array, in accordance with some alternative embodiments of the present disclosure.

FIG. 2 illustrates a top view (or a layout) of OTP memory cells 102 in the OTP memory array 100, in accordance with some alternative embodiments of the present disclosure. For the sake of simplicity, FIG. 2 shows a portion of the OTP memory array 100 with the OTP memory cells 102-1, 102-2, 102-5, and 102-6. It should be noted that other OTP memory cells 102 shown in FIG. 1A may be alternatively configured as the configuration shown in FIG. 2. The like reference numerals are used throughout the figures to designate similar or equivalent elements. The OTP memory cells 102-1, 102-2, 102-5, and 102-6 shown in FIG. 2 similar to the OTP memory cells 102-1, 102-2, 102-5, and 102-6 shown in FIGS. 1A to 1C discussed above, except that each of the OTP memory cells 102 in FIG. 2 includes three transistors.

The OTP memory array 100 shown in FIG. 2 includes more gate structures engaging the active areas 104 to provide each of the OTP memory cells 102 with more transistors. For example, the OTP memory array 100 further includes gate structures 202-1 and 202-2 (may be collectively referred to as gate structures 202), as shown in FIG. 2. In the OTP memory array 100 shown in FIG. 2, the gate structures 202-1 and 202-2 engages the respective active areas 104-1 and 104-3 to construct transistors T33 to T36 for the OTP memory cells 102-1, 102-2, 102-5, and 102-6. The gate structures 202-1 and 202-2 are extend lengthwise in the Y-direction, and arranged with gate structures 106 in the X-direction, as shown in FIG. 2. More specifically, the gate structure 202-1 is between the gate structures 106-1 and 106-2 in the X-direction and the gate structure 202-2 is between the gate structures 106-3 and 106-4 in the X-direction.

Each of the OTP memory cells 102-1, 102-2, 102-5, and 102-6 further includes the channel layers 114 in the channel regions of the respective active areas 104-1 and 104-3 and wrapped around by the gate structures 202-1 and 202-2 (not shown, but can refer to FIGS. 1B and 1C). These channel layers 114 wrapped around by the gate structures 202-1 and 202-2 also attach on the wall structure 108-1, as discussed above. The gate structures 202-1 and 202-2 and the channel layers 114 construct the transistors T33 to T36 for the OTP memory cells 102-1, 102-2, 102-5, and 102-6. For example, the OTP memory cell 102-2 further includes the transistor T34, and the OTP memory cell 102-6 further includes the transistor T36. Therefore, each of the OTP memory cells 102-1, 102-2, 102-5, and 102-6 shown in FIG. 2 includes three transistors.

As discussed above, the transistors T2, T3, T10, and T11 serve as access transistors, and the transistors T1, T4, T9, and T12 serve as anti-fuse transistors. The transistors T33, T34, T35, and T36 serve as following transistors. The gate structures 202-1 and 202-2 for the transistors T33, T34, T35, and T36 are also referred to as following gate structures. The transistors T33, T34, T35, and T36 are used to avoid the gradient between the voltages applied to the gate structures 106 for transistors serving as anti-fuse transistors and gate structures 106 for transistors serving as access transistors changing too quickly. In the case that the OTP memory cells 102 including following transistors, when in the programming operation or in the reading operation discussed above, a turn-on voltage is applied to the transistors serving as following transistors (more specifically, the gate structures 202-1 and 202-2) to turn on the transistors serving as following transistors during the programming operation or in the reading operation. In some embodiments, the turn-on voltage applied to the transistors serving as following transistors is less than the turn-on voltage applied to the transistors serving as access transistors discussed above.

Similarly, in some embodiments, in the OTP memory array 100 shown in FIG. 2, some random OTP memory cells 102 are configured as P-type OTP memory cells with P-type transistors, and the other OTP memory cells 102 are configured as N-type OTP memory cells with N-type transistors. For example, the OTP memory cells 102-1 and 102-6 are configured as P-type OTP memory cells, and the other OTP memory cells 102 are configured as N-type OTP memory cells. In other embodiments, the OTP memory cells 102-2 and 102-6 are configured as P-type OTP memory cells, and the other OTP memory cells 102 are configured as N-type OTP memory cells. In yet some embodiments, the OTP memory cells 102-5 and 102-6 are configured as P-type OTP memory cells, and the other OTP memory cells 102 are configured as N-type OTP memory cells.

Figure 3:
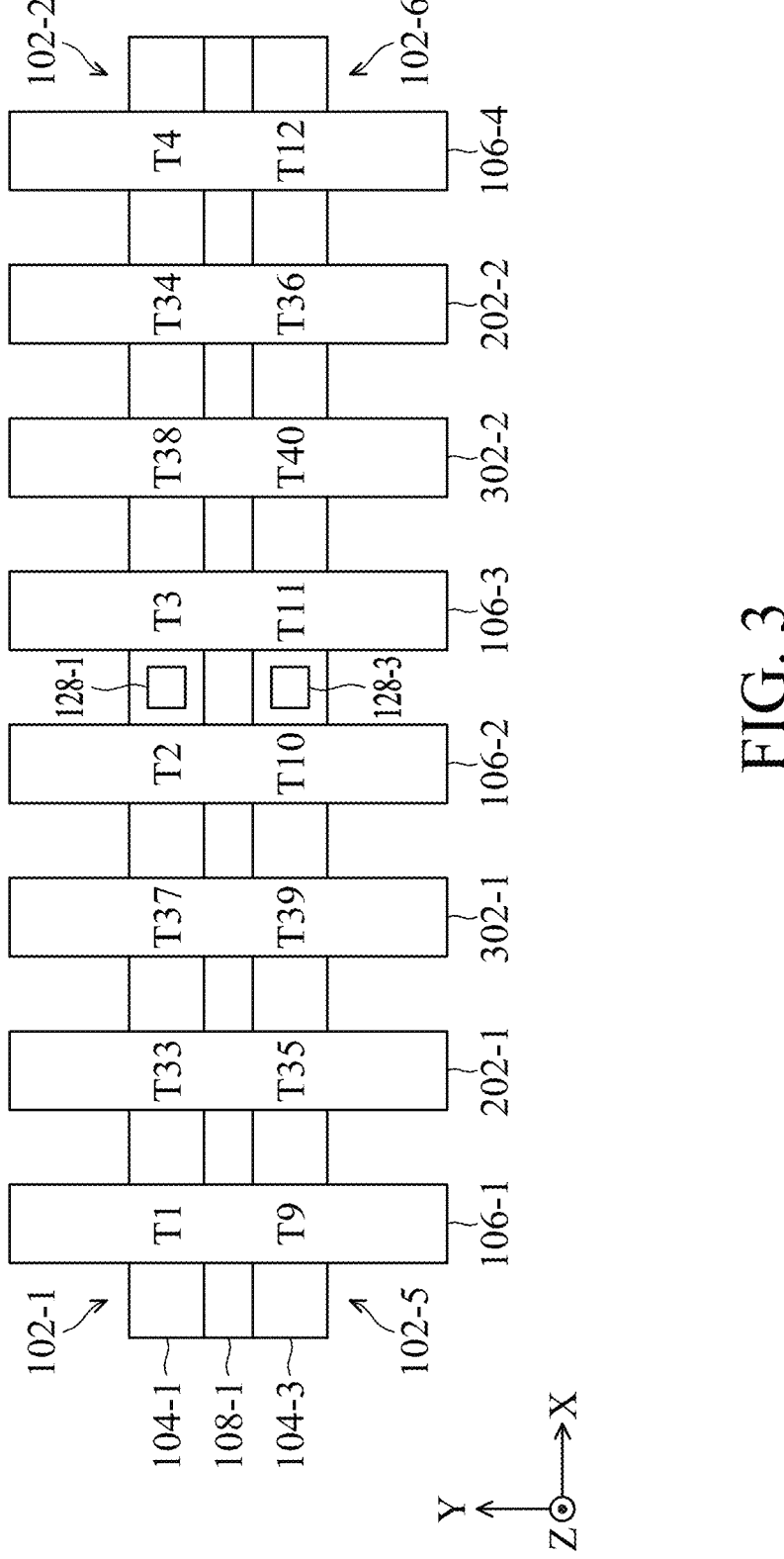
FIG. 3 illustrates a top view (or a layout) of OTP memory cells in the OTP memory array, in accordance with some alternative embodiments of the present disclosure.

FIG. 3 illustrates a top view (or a layout) of OTP memory cells 102 in the OTP memory array 100, in accordance with some alternative embodiments of the present disclosure. For the sake of simplicity, FIG. 3 shows a portion of the OTP memory array 100 with the OTP memory cells 102-1, 102-2, 102-5, and 102-6. It should be noted that other OTP memory cells 102 shown in FIGS. 1A and 2 may be alternatively configured as the configuration shown in FIG. 3. The like reference numerals are used throughout the figures to designate similar or equivalent elements. The OTP memory cells 102-1, 102-2, 102-5, and 102-6 shown in FIG. 3 similar to the OTP memory cells 102-1, 102-2, 102-5, and 102-6 shown in FIG. 2 discussed above, except that each of the OTP memory cells 102 in FIG. 3 includes four transistors.

The OTP memory array 100 shown in FIG. 3 includes more gate structures engaging the active areas 104 to provide each of the OTP memory cells 102 with more transistors. For example, the OTP memory array 100 further includes gate structures 302-1 and 302-2 (may be collectively referred to as gate structures 302), as shown in FIG. 3. In the OTP memory array 100 shown in FIG. 3, the gate structures 302-1 and 302-2 engages the respective active areas 104-1 and 104-3 to construct transistors T37 to T40 for the OTP memory cells 102-1, 102-2, 102-5, and 102-6. The gate structures 302-1 and 302-2 are extend lengthwise in the Y-direction, and arranged with gate structures 106 and 202 in the X-direction, as shown in FIG. 3. More specifically, the gate structure 302-1 is between the gate structures 202-1 and 106-2 in the X-direction and the gate structure 302-2 is between the gate structures 202-2 and 106-3 in the X-direction.

Each of the OTP memory cells 102-1, 102-2, 102-5, and 102-6 further includes the channel layers 114 in the channel regions of the respective active areas 104-1 and 104-3 and wrapped around by the gate structures 302-1 and 302-2 (not shown, but can refer to FIGS. 1B and 1C). These channel layers 114 wrapped around by the gate structures 302-1 and 302-2 also attach on the wall structure 108-1, as discussed above. The gate structures 302-1 and 302-2 and the channel layers 114 construct the transistors T37 to T40 for the OTP memory cells 102-1, 102-2, 102-5, and 102-6. For example, the OTP memory cell 102-2 further includes the transistor T38, and the OTP memory cell 102-6 further includes the transistor T40. Therefore, each of the OTP memory cells 102-1, 102-2, 102-5, and 102-6 shown in FIG. 3 includes four transistors.

As discussed above, the transistors T2, T3, T10, and T11 serve as access transistors, the transistors T1, T4, T9, and T12 serve as anti-fuse transistors, and the transistors T33, T34, T35, and T36 serve as following transistors. In the present embodiments, the transistors T37, T38, T39, and T40 also serve as access transistors. Therefore, each of the OTP memory cells 102 in the OTP memory array 100 shown in FIG. 3 has two access transistors, one following transistor, and one anti-fuse transistor. The gate structures 302-1 and 302-2 for the transistors T37, T38, T39, and T40 are also referred to as word-line gate structures, similar to the gate structures 106-2 and 106-3. In some embodiments, the gate structures 302 and 106 for the transistors serving as access transistors in one OTP memory cell 102 are electrically connected with each other through metal lines and vias in the IMD layer(s) over the ILD layer 130. In other embodiments, the gate structures 302 and 106 for the transistors serving as access transistors in one OTP memory cell 102 are electrically isolated from each other.

Similarly, in some embodiments, in the OTP memory array 100 shown in FIG. 3, some random OTP memory cells 102 are configured as P-type OTP memory cells with P-type transistors, and the other OTP memory cells 102 are configured as N-type OTP memory cells with N-type transistors. For example, the OTP memory cells 102-1 and 102-6 are configured as P-type OTP memory cells, and the other OTP memory cells 102 are configured as N-type OTP memory cells. In other embodiments, the OTP memory cells 102-2 and 102-6 are configured as P-type OTP memory cells, and the other OTP memory cells 102 are configured as N-type OTP memory cells. In yet some embodiments, the OTP memory cells 102-5 and 102-6 are configured as P-type OTP memory cells, and the other OTP memory cells 102 are configured as N-type OTP memory cells.

Figure 4:
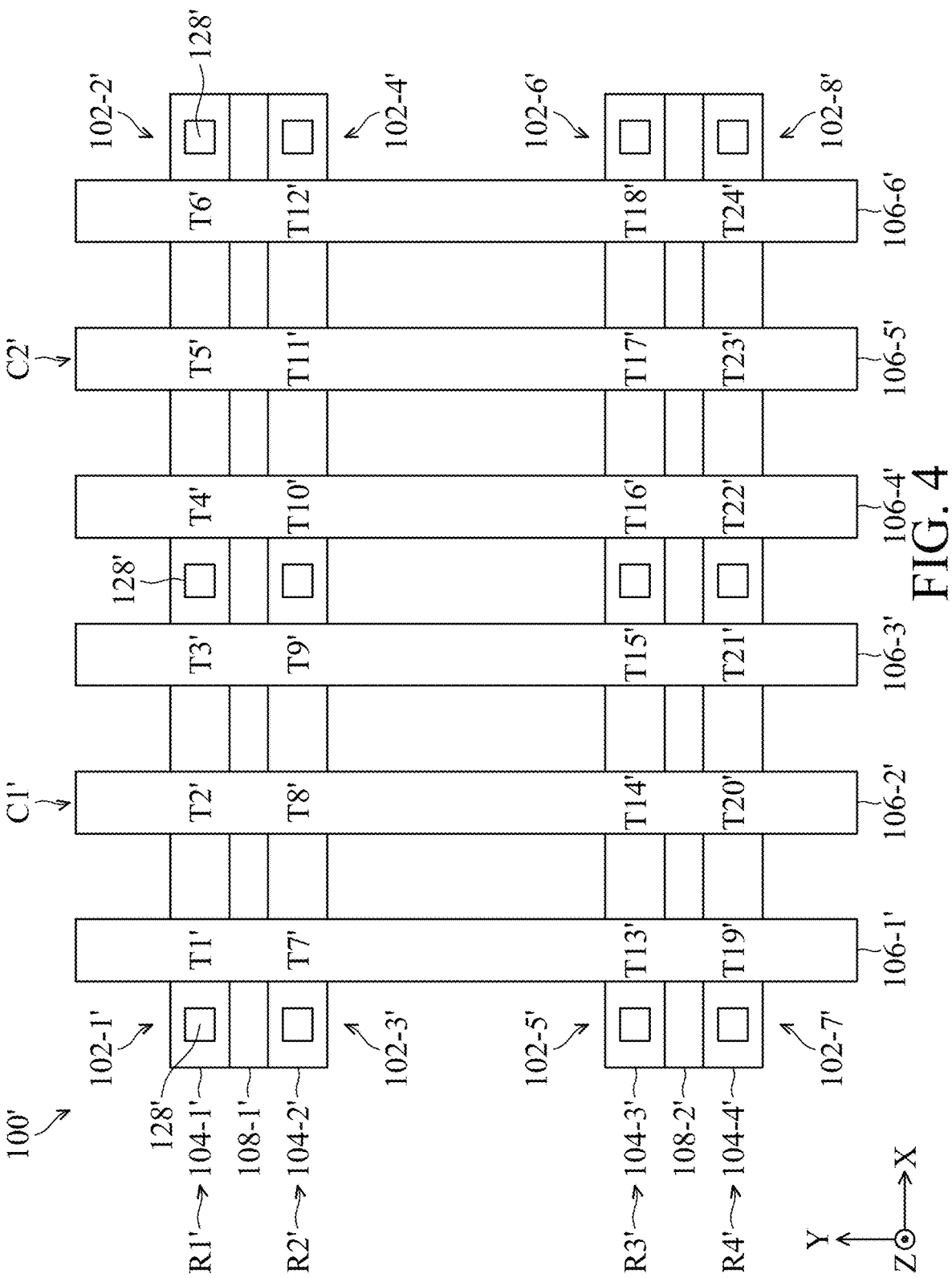
FIG. 4 illustrates a top view (or a layout) of an OTP memory array of OTP memory cells in an OTP memory device, in portion or entirety, in accordance with some alternative embodiments of the present disclosure.

FIG. 4 illustrates a top view (or a layout) of an OTP memory array 100' of OTP memory cells 102' in an OTP memory device, in portion or entirety, in accordance with some alternative embodiments of the present disclosure. The OTP memory array 100' is similar to the OTP memory array 100 shown in FIG. 1A. The OTP memory array 100' shown in FIG. 4 includes the OTP memory cells 102' (including the OTP memory cells 102-1' to 102-24') arranged in rows and columns. More specifically, the OTP memory cells 102-1' to 102-24' are arranged in four rows R1' to R4' and two columns C1' and C2'. Therefore, as shown in FIG. 4, the OTP memory array 100' is a 2×4 array, in accordance with some embodiments. It should be noted that the OTP memory array 100' may have more OTP memory cells arranged in more rows and more columns. The OTP memory array 100' may be a portion of entire OTP memory array, in accordance with some embodiments.

The OTP memory array 100' includes active areas, such as active areas 104-1' to 104-4', (may be collectively referred to as active areas 104') that extend lengthwise in the X-direction. Each of active areas 104' includes channel regions, source regions, and drain regions (where source regions and drain regions are collectively referred to as source/drain regions herein) of transistors of the OTP memory array 100'. In some embodiments, each of the active areas 104-1' to 104-4' are disposed over an N-type well (or N-Well) or a P-type well (or P-Well).

As shown in FIG. 4, each of the OTP memory cells 102' has one of the active areas 104-1' to 104-4'. For example, the OTP memory cells 102-2' has the active area 104-1'. Furthermore, the adjacent two OTP memory cells 102' (that are respectively in adjacent two columns of the OTP memory array 100') in the X-direction share one active area 104'. For example, the OTP memory cells 102-1' and 102-2' share the active area 104-1'. Although not shown in FIG. 4, the OTP memory cells 102' in the same row share the same active area 104'. In other words, the active areas 104' continuously extend in the X-direction, different to the active area 104 shown in FIG. 1A.

The OTP memory array 100' further includes gate structures, such as gate structures 106-1' to 106-6' (may be collectively referred to as gate structures 106'). The gate structures 106-1' to 106-6' extend substantially parallel to one another, extend lengthwise in the Y-direction perpendicular to the X-direction, and are separated from each other in the X-direction, as shown in FIG. 4. The gate structures 106-1' to 106-6' are disposed over the channel regions of the respective active areas 104-1' to 104-4' (i.e., the (vertically stacked) channel layers 114 discussed above) and disposed between respective source/drain regions of the active areas 104-1' to 104-4' (i.e., source/drain features 124 discussed above). In some embodiments, gate structures 106-1' to 106-6' wrap and/or surround suspended, vertically stacked channel layers 114 in the channel regions of the active areas 104-1' to 104-4', respectively.

Similar to above discussion, the active areas 104-1' to 104-4' and the gate structures 106-1' to 106-6' are configured to provide each of the OTP memory cell 102-1' to 102-8' with transistors. For example, in the OTP memory cells 102-2', the gate structure 106-4' to 106-6' engages the active area 104-1' to respectively construct transistors T4' to T6'. More specifically, the gate structures 106-1' to 106-6' respectively engages the active areas 104-1' to 104-4' to construct transistors T1' to T24', as shown in FIG. 4. Furthermore, as shown in FIG. 4, each of the OTP memory cells 102-1' to 102-8' includes three transistors, in accordance with some embodiments. For example, the OTP memory cell 102-2' includes the transistors T4' to T6', and the OTP memory cell 102-4' includes the transistors T10' to T12'.

Similar to above discussion, referring to FIG. 4, the OTP memory array 100' further includes wall structures 108', such as wall structures 108-1' and 108-2', (may be collectively referred to as wall structures 108') that extend lengthwise in the X-direction (e.g., parallel to the active areas 104'). As shown in FIG. 4, the active areas 104' interface the wall structures 108'. More specifically, the adjacent two active areas 104' in the Y-direction are on opposite sides of the wall structure 108' in the Y-direction. For example, the active areas 104-1' and 104-2' are on the opposite sides of the wall structure 108-1' in the Y-direction. In some aspects, the wall structures 108' are between the adjacent active areas 104' in the Y-direction. For example, the wall structure 108-1' is between the adjacent active areas 104-1' and 104-2' in the Y-direction, as shown in FIG. 4.

Therefore, similar to above discussion, the channel layers 114 for the three transistors in each of the OTP memory cells 102' are also attached on the wall structures 108' in the Y-direction. Similarly, each of the wall structures 108' may be in contact with (sidewalls of) the channel layers 114 in the adjacent rows of the OTP memory array 100'. In other words, the channel layers 114 are in contact with sidewalls of the wall structures 108' in the Y-direction. In some aspects, the channel layers 114 are on opposite sides of the wall structures 108' in the Y-direction. Therefore, the channel layers 114 and the wall structures 108' construct fork sheet structures, as discussed above.

As discussed above, the gate structures 106' engage the active areas 104' to construct the transistors T1' to T24'. More specifically, the gate structures 106-1' to 106-6' wrap around the channel layers 114 in the channel regions of the active areas 104-1' to 104-4'. For example, the gate structure 106-3' wraps around the channel layers 114 in the channel regions of the active areas 104-1' and 104-2'. Each of the gate structures 106-1' to 106-6' also has a gate dielectric layer 116 and a gate electrode layer 118 discussed above. The gate dielectric layers 116 wrap around each of the channel layers 114 in the active areas 104' and the gate electrode layers 118 wrap around the gate dielectric layer 116.

Similar to above discussion, the OTP memory array 100' further includes source/drain features 124 in the source/drain regions of the active areas 104'. More specifically, the source/drain features 124 are respectively disposed between the two respective gate structures 106', may similar to that shown in FIG. 1C. The source/drain features 124 are disposed on opposite sides of the respective gate structure 106' in the X-direction to form transistor (e.g., the transistors T1' to T24').

Similar to above discussion, referring to FIG. 4, the OTP memory array 100' further includes source/drain contacts 128', over and electrically connected to the source/drain features 124. As shown in FIG. 4, in the top view, the source/drain contacts 128' are between the gate structures 106' in the X-direction. Furthermore, each of the source/drain contacts 128' is shared by two OTP memory cells 102'. As discussed above, each of the source/drain contacts 128' is over and electrically connected to the respective source/drain features 124.

Similar to above discussion, although not shown in FIG. 4, the source/drain contacts 128' in the same row of the OTP memory array 100' are electrically connected to a metal line serving as a bit-line (the metal line may be referred to as bit-line) in a IMD layer over the ILD layer 130. In the present embodiments, the OTP memory array 100' is also an anti-fuse OTP memory array. Each of the OTP memory cells 102-1' to 102-8' shown in FIG. 4 is an anti-fuse OTP memory cell and has two transistor serving as access transistor and one serving as anti-fuse transistor, different to the OTP memory cells 102 shown in FIG. 1A. More specifically, as shown in FIG. 4, the transistors T1', T3', T4', T6', T7', T9', T10', T12', T13', T15', T16', T18', T19', T21', T22', and T24' serve as access transistors, and the transistors T2', T5', T8', T11', T14', T17', T20', and T23' serve as anti-fuse transistors.

Similarly, the transistors in the same column share the same gate structures 106'. For example, the transistors T1', T7', T13', and T19' share the gate structure 106-1', the transistors T2', T8', T14', and T20' share the gate structure 106-2', and the transistors T3', T9', T15', and T21' share the gate structure 106-3', as shown in FIG. 4. The gate structures 106-1', 106-3', 106-4', and 106-6' for the transistors serving as access transistors are also serve as word-lines of the OTP memory cells 102'. In some embodiments, the gate structures 106' serving as the word-lines are also referred to as word-line gate structures. The gate structures 106-2' and 106-5' for the transistors serving as anti-fuse transistors are also referred to as anti-fuse gate structures. Therefore, the gate structures 106' and the bit-lines (not shown, but the bit-lines electrically connected to the source/drain contacts 128' in the same rows, as discussed above) are selected to program/read the OTP memory cells 102'.

In some embodiments, the gate structures 106' for the transistors serving as access transistors in the OTP memory cells 102' in the same column are electrically connected with each other through metal lines and vias in the IMD layer(s) over the ILD layer 130. For example, the gate structures 106-1' and 106-3' are electrically connected with each other, and the gate structures 106-4' and 106-6' are electrically connected with each other. Furthermore, in some embodiments, the gate structures 106' for the transistors serving as access transistors are on opposite sides of the gate structures 106' for the transistors serving as anti-fuse transistors. For example, the gate structures 106-1' and 106-3' are on opposite sides of the gate structure 106-2', and the gate structures 106-4' and 106-6' are on opposite sides of the gate structure 106-5'. In other words, the gate structures 106' for the transistors serving as anti-fuse transistors are between the gate structures 106' for the transistors serving as access transistors. For example, the gate structure 106-2' is between the gate structures 106-1' and 106-3', and the gate structure 106-5' is between the gate structures 106-4' and 106-6'.

In some embodiments, each of the source/drain contacts 128' is adjacent to the gate structures 106' serving as the word-line gate structures. Furthermore, each of the source/drain contacts 128' is between adjacent two gate structures 106' serving as the word-line gate structures in adjacent two OTP memory cells 102' in the X-direction. Also, in some aspects, each of the source/drain contacts 128' is between adjacent two transistors serving as the access transistors in adjacent two OTP memory cells 102' in the X-direction.

Similar to above discussion, one or more OTP memory cells 102' are configured as P-type OTP memory cells with P-type transistors for security. These P-type OTP memory cells may be referred to as secure OTP memory cells. In some embodiments, in the OTP memory array 100' shown in FIG. 4, some random OTP memory cells 102' are configured as P-type OTP memory cells, and the other OTP memory cells 102' are configured as N-type OTP memory cells. For example, the OTP memory cells 102-2', 102-3', 102-5', and 102-7' are configured as P-type OTP memory cells, and the other OTP memory cells 102' are configured as N-type OTP memory cells.

In some embodiments, in the OTP memory array 100' shown in FIG. 4, some OTP memory cells 102' in the same rows are configured as P-type OTP memory cells, and the other OTP memory cells 102' are configured as N-type OTP memory cells. For example, the OTP memory cells 102-3' and 102-4' in the same row R2' and/or the OTP memory cells 102-7' and 102-8' in the same row R4' are configured as P-type OTP memory cells, and the other OTP memory cells 102' are configured as N-type OTP memory cells.

In some embodiments, in the OTP memory array 100' shown in FIG. 4, the P-type OTP memory cells and the N-type OTP memory cells are arranged in a checkerboard pattern. For example, the OTP memory cells 102-1', 102-4', 102-5', and 102-8' are configured as P-type OTP memory cells, and the other OTP memory cells 102' are configured as N-type OTP memory cells.

Figure 5:
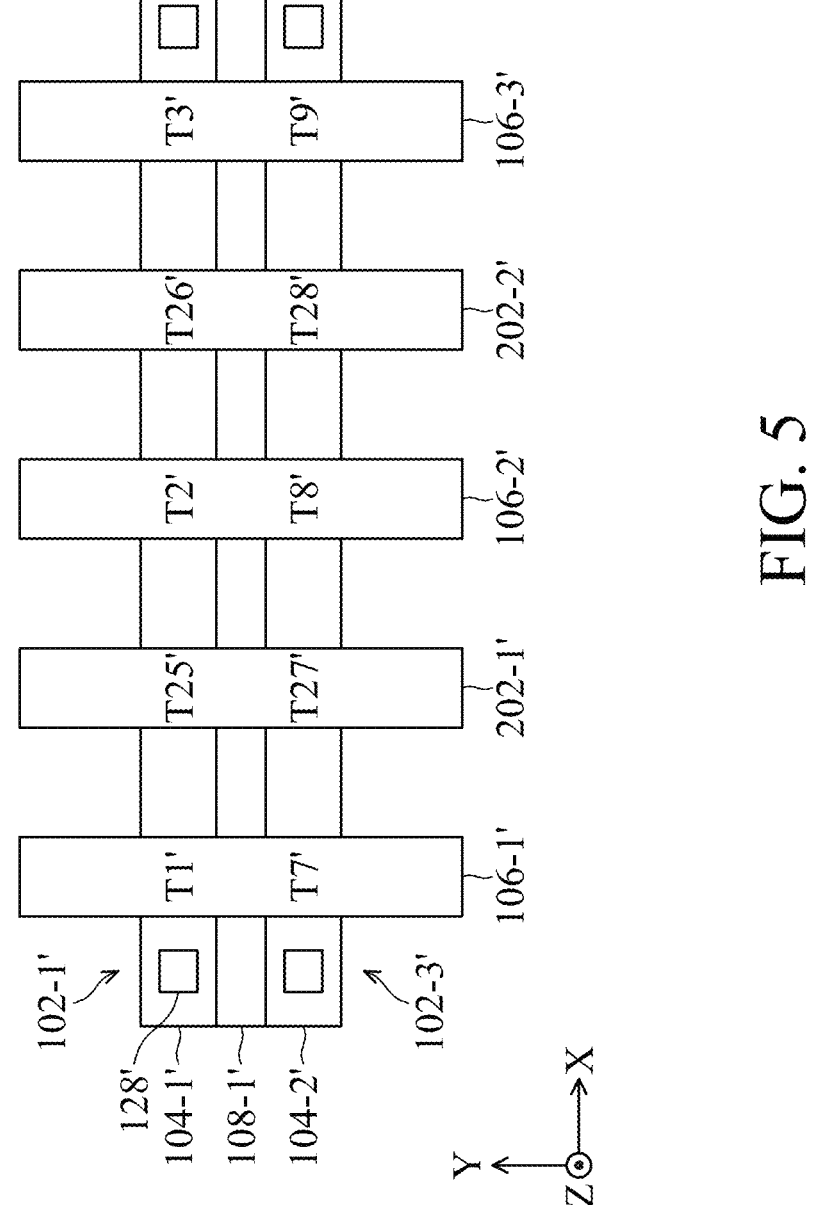
FIG. 5 illustrates a top view (or a layout) of an OTP memory cell in the OTP memory array, in accordance with some alternative embodiments of the present disclosure.

FIG. 5 illustrates a top view (or a layout) of OTP memory cells 102' in the OTP memory array 100', in accordance with some alternative embodiments of the present disclosure. For the sake of simplicity, FIG. 5 shows a portion of the OTP memory array 100' with the OTP memory cells 102-1' and 102-3'. It should be noted that other OTP memory cells 102' shown in FIG. 4 may be alternatively configured as the configuration shown in FIG. 5. The like reference numerals are used throughout the figures to designate similar or equivalent elements. The OTP memory cells 102-1' and 102-3' shown in FIG. 5 similar to the OTP memory cells 102-1' and 102-3' shown in FIG. 4 discussed above, except that each of the OTP memory cells 102' in FIG. 5 includes five transistors.

The OTP memory array 100' shown in FIG. 5 includes more gate structures engaging the active areas 104' to provide each of the OTP memory cells 102' with more transistors. For example, the OTP memory array 100' further includes gate structures 202-1' and 202-2' (may be collectively referred to as gate structures 202'), as shown in FIG. 5. In the OTP memory array 100' shown in FIG. 5, the gate structures 202-1' and 202-2' engages the respective active areas 104-1' and 104-2' to construct transistors T25' to T28' for the OTP memory cells 102-1' and 102-3'. The gate structures 202-1' and 202-2' are extend lengthwise in the Y-direction, and arranged with gate structures 106' in the X-direction, as shown in FIG. 5. More specifically, the gate structure 202-1' is between the gate structures 106-1' and 106-2' in the X-direction and the gate structure 202-2' is between the gate structures 106-2' and 106-3' in the X-direction.

Each of the OTP memory cells 102-1' and 102-3' further includes the channel layers 114 in the channel regions of the respective active areas 104-1' and 104-2' and wrapped around by the gate structures 202-1' and 202-2' (not shown, but can refer to FIGS. 1B and 1C). These channel layers 114 wrapped around by the gate structures 202-1' and 202-2' also attach on the wall structure 108-1', as discussed above. The gate structures 202-1' and 202-2' and the channel layers 114 construct the transistors T25' to T28' for the OTP memory cells 102-1' and 102-3'. For example, the OTP memory cell 102-1' further includes the transistors T25' and T26', and the OTP memory cell 102-3' further includes the transistors T27' and T28'. Therefore, each of the OTP memory cells 102-1' and 102-3' shown in FIG. 5 includes five transistors.

As discussed above, the transistors T1', T3', T7', and T9' serve as access transistors, and the transistors T2' and T8' serve as anti-fuse transistors. The transistors T25', T26', T27', and T28' serve as following transistors. The gate structures 202-1' and 202-2' for the transistors T25', T26', T27', and T28' are also referred to as following gate structures. The transistors T25', T26', T27', and T28' are used to avoid the gradient between the voltages applied to the gate structures 106' for transistors serving as anti-fuse transistors and gate structures 106' for transistors serving as access transistors changing too quickly.

In some embodiments, the gate structures 202' for the transistors serving as following transistors in the OTP memory cells 102' in the same column are electrically connected with each other through metal lines and vias in the IMD layer(s) over the ILD layer 130. For example, the gate structures 202-1' and 202-2' are electrically connected with each other. Furthermore, in some embodiments, the gate structures 202' for the transistors serving as following transistors are on opposite sides of the gate structures 106' for the transistors serving as anti-fuse transistors. For example, the gate structures 202-1' and 202-2' are on opposite sides of the gate structure 106-2'. In other words, the gate structures 106' for the transistors serving as anti-fuse transistors are between the gate structures 202' for the transistors serving as following transistors. For example, the gate structure 106-2' is between the gate structures 202-1' and 202-2'.

Similarly, in some embodiments, in the OTP memory array 100' shown in FIG. 5, some random OTP memory cells 102' are configured as P-type OTP memory cells with P-type transistors, and the other OTP memory cells 102 are configured as N-type OTP memory cells with N-type transistors. For example, the OTP memory cells 102-2' are configured as P-type OTP memory cell, and the OTP memory cell 102-1' are configured as N-type OTP memory cell.

Figure 6:
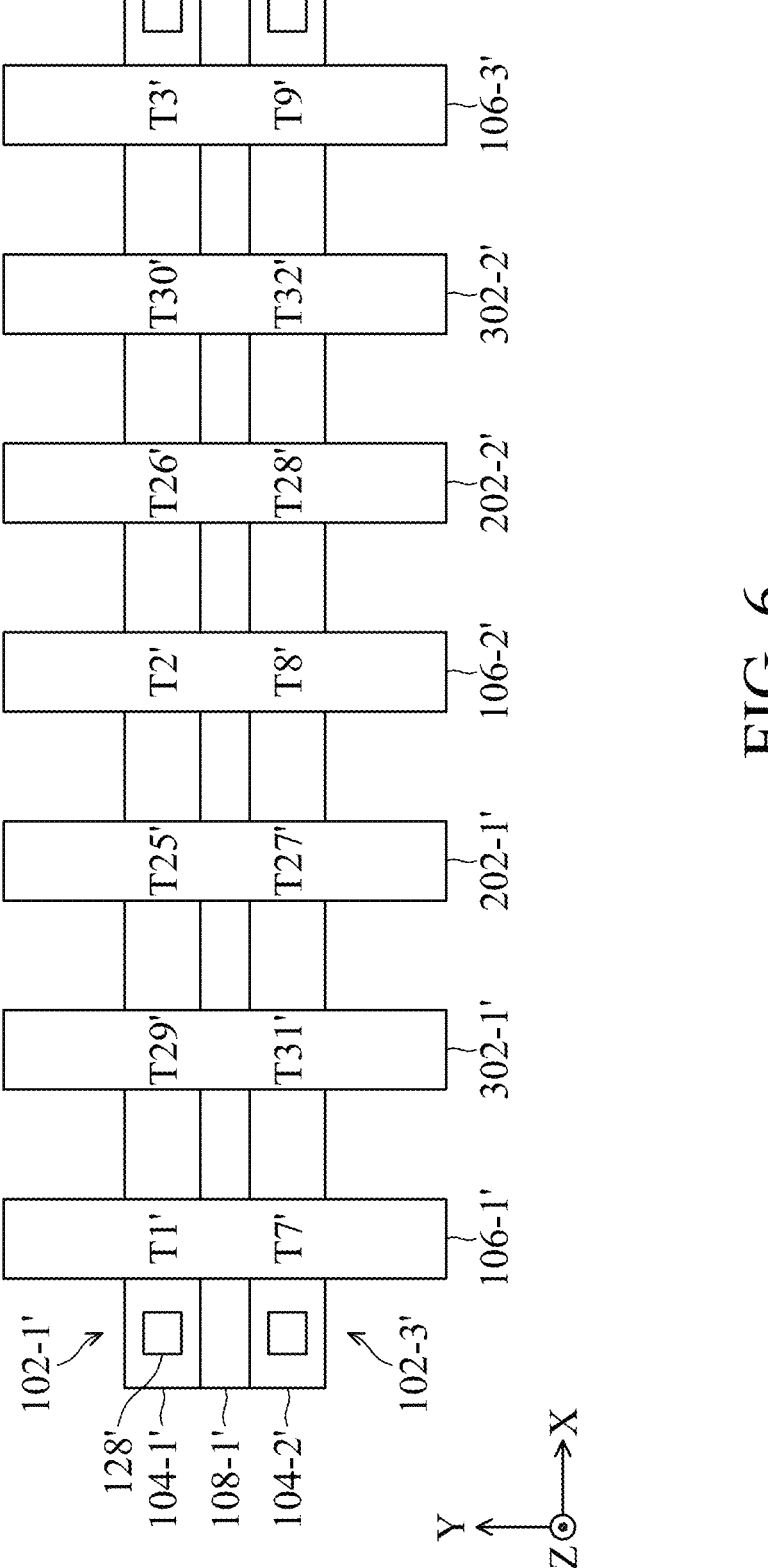
FIG. 6 illustrates a top view (or a layout) of an OTP memory cell in the OTP memory array, in accordance with some alternative embodiments of the present disclosure.

FIG. 6 illustrates a top view (or a layout) of OTP memory cells 102' in the OTP memory array 100', in accordance with some alternative embodiments of the present disclosure. For the sake of simplicity, FIG. 6 shows a portion of the OTP memory array 100' with the OTP memory cells 102-1' and 102-3'. It should be noted that other OTP memory cells 102' shown in FIGS. 4 and 5 may be alternatively configured as the configuration shown in FIG. 6. The like reference numerals are used throughout the figures to designate similar or equivalent elements. The OTP memory cells 102-1' and 102-3' shown in FIG. 6 similar to the OTP memory cells 102-1' and 102-3' shown in FIG. 5 discussed above, except that each of the OTP memory cells 102-1' and 102-3' in FIG. 6 includes seven transistors.

The OTP memory array 100 shown in FIG. 6 includes more gate structures engaging the active areas 104' to provide each of the OTP memory cells 102' with more transistors. For example, the OTP memory array 100 further includes gate structures 302-1 and 302-2 (may be collectively referred to as gate structures 302'), as shown in FIG. 6. In the OTP memory array 100' shown in FIG. 6, the gate structures 302-1' and 302-2' engages the respective active areas 104-1' and 104-2' to construct transistors T29' to T32' for the OTP memory cells 102-1' and 102-3'. The gate structures 302-1' and 302-2' are extend lengthwise in the Y-direction, and arranged with gate structures 106' and 202' in the X-direction, as shown in FIG. 6. More specifically, the gate structure 302-1' is between the gate structures 106-1' and 202-1' in the X-direction and the gate structure 302-2' is between the gate structures 106-3' and 202-2' in the X-direction.

Each of the OTP memory cells 102-1' and 102-3' further includes the channel layers 114 in the channel regions of the respective active areas 104-1' and 104-2' and wrapped around by the gate structures 302-1' and 302-2' (not shown, but can refer to FIGS. 1B and 1C). These channel layers 114 wrapped around by the gate structures 302-1' and 302-2' also attach on the wall structure 108-1', as discussed above. The gate structures 302-1' and 302-2' and the channel layers 114 construct the transistors T29' to T32' for the OTP memory cells 102-1' and 102-3'. For example, the OTP memory cell 102-1' further includes the transistors T29' and T30', and the OTP memory cell 102-3' further includes the transistors T31' and 32'. Therefore, each of the OTP memory cells 102-1' and 102-3' shown in FIG. 6 includes seven transistors.

As discussed above, the transistors T1', T3', T7', and T9' serve as access transistors, the transistors T2' and T8' serve as anti-fuse transistors, and the transistors T25', T26', T27', and T28' serve as following transistors. In the present embodiments, the transistors T29', T30', T31', and T32' also serve as access transistors. Therefore, each of the OTP memory cells 102' in the OTP memory array 100' shown in FIG. 6 has four access transistors, two following transistor, and one anti-fuse transistor. The gate structures 302-1' and 302-2' for the transistors T29', T30', T31', and T32' are also referred to as word-line gate structures, similar to the gate structures 106-1' and 106-3'. In some embodiments, the gate structures 302' and 106' for the transistors serving as access transistors in one OTP memory cell 102' are electrically connected with each other through metal lines and vias in the IMD layer(s) over the ILD layer 130. In other embodiments, the gate structures 302' for the transistors serving as access transistors are electrically isolated from the gate structures 106' for the transistors serving as access transistors in one OTP memory cell 102'.

In some embodiments, the gate structures 302' for the transistors serving as access transistors in the OTP memory cells 102' in the same column are electrically connected with each other through metal lines and vias in the IMD layer(s) over the ILD layer 130. For example, the gate structures 302-1' and 302-2' are electrically connected with each other. Furthermore, in some embodiments, the gate structures 302' for the transistors serving as access transistors are on opposite sides of the gate structures 106' for the transistors serving as anti-fuse transistors. For example, the gate structures 302-1' and 302-2' are on opposite sides of the gate structure 106-2'. In other words, the gate structures 106' for the transistors serving as anti-fuse transistors are between the gate structures 302' for the transistors serving as access transistors. For example, the gate structure 106-2' is between the gate structures 302-1' and 302-2'.

Similarly, in some embodiments, in the OTP memory array 100' shown in FIG. 6, some random OTP memory cells 102' are configured as P-type OTP memory cells with P-type transistors, and the other OTP memory cells 102 are configured as N-type OTP memory cells with N-type transistors. For example, the OTP memory cells 102-2' are configured as P-type OTP memory cell, and the OTP memory cell 102-1' are configured as N-type OTP memory cell.

The embodiments of the present disclosure offer advantages over existing art, though it should be understood that other embodiments may offer different advantages, not all advantages are necessarily discussed herein, and that no particular advantage is required for all embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time-programmable (OTP) memory device, comprising:
a memory array, comprising:
an N-type memory cell in a first row, wherein the N-type memory cell comprising:

first channel layers spaced apart from each other in a Z-direction;
a first word-line gate structure extending in a Y-direction and wrapping around the first channel layers;
second channel layers spaced apart from each other in the Z-direction; and
a anti-fuse gate structure extending in the Y-direction and wrapping around the second channel layers;
a P-type memory cell in a second row adjacent to the first row in the Y-direction, wherein the P-type memory cell comprising:
third channel layers spaced apart from each other in the Z-direction;
the first word-line gate structure wrapping around the third channel layers;
fourth channel layers spaced apart from each other in the Z-direction; and
the anti-fuse gate structure wrapping around the fourth channel layers; and
a wall structure extending in an X-direction and between the N-type memory cell and the P-type memory cell in the Y-direction, wherein the first channel layers, the second channel layers, the third channel layers, and the fourth channel layers attach on the wall structure,
wherein when in a programming operation, a turn-on voltage is applied to the first word-line gate structure and a program voltage is applied to the anti-fuse gate structure, such that the N-type memory cell is in a low-impedance storage state and the P-type memory cell is in a high-impedance storage state.

2. The OTP memory device as claimed in claim 1, wherein the N-type memory cell further comprises:
a first access transistor constructed by the first channel layers and the first word-line gate structure; and
a first anti-fuse transistor constructed by the second channel layers and the anti-fuse gate structure,
wherein the P-type memory cell further comprises:
a second access transistor constructed by the third channel layers and the first word-line gate structure; and
a second anti-fuse transistor constructed by the fourth channel layers and the anti-fuse gate structure,
wherein when in the programming operation, the turn-on voltage is applied to the first access transistor and the second access transistor and the program voltage is applied to the first anti-fuse transistor and the second anti-fuse transistor, such that first access transistor is turned on and the second access transistor is turned off, thereby a gate dielectric layer of the first anti-fuse transistor of the N-type memory cell is ruptured and a gate dielectric layer of the second anti-fuse transistor of the P-type memory cell is not ruptured.

3. The OTP memory device as claimed in claim 1, wherein when in a reading operation, the turn-on voltage is applied to the first word-line gate structure and a read voltage is applied to the anti-fuse gate structure, such that a reading current of the N-type memory cell is greater than a reading current of the P-type memory cell.

4. The OTP memory device as claimed in claim 3, wherein the N-type memory cell further comprises fifth channel layers spaced apart from each other in the Z-direction, and the P-type memory cell further comprises sixth channel layers spaced apart from each other in the Z-direction,
wherein the OTP memory device further comprises a following gate structure extending in the Y-direction and wrapping around the fifth channel layers and the sixth channel layers, wherein the fifth channel layers and the sixth channel layers attach on the wall structure.

5. The OTP memory device as claimed in claim 4, wherein the turn-on voltage is a first turn-on voltage, wherein in the programming operation or in the reading operation, a second turn-on voltage is applied to the following gate structure.

6. The OTP memory device as claimed in claim 4, wherein the N-type memory cell further comprises seventh channel layers spaced apart from each other in the Z-direction, and the P-type memory cell further comprises eighth channel layers spaced apart from each other in the Z-direction, wherein the OTP memory device further comprises a second word-line gate structure extending in the Y-direction and wrapping around the seventh channel layers and the eighth channel layers, wherein the seventh channel layers and the eighth channel layers attach on the wall structure.

7. The OTP memory device as claimed in claim 1, wherein the N-type memory cell further comprises fifth channel layers spaced apart from each other in the Z-direction, and the P-type memory cell further comprises sixth channel layers spaced apart from each other in the Z-direction, wherein the OTP memory device further comprises a second word-line gate structure extending in the Y-direction and wrapping around the fifth channel layers and the sixth channel layers, wherein the first word-line gate structure and the second word-line gate structure are electrically connected with each other, wherein the anti-fuse gate structure is between the first word-line gate structure and the second word-line gate structure in the X-direction, wherein the fifth channel layers and the sixth channel layers attach on the wall structure.

8. The OTP memory device as claimed in claim 7, wherein the N-type memory cell further comprises:

seventh channel layers spaced apart from each other in the Z-direction; and eighth channel layers spaced apart from each other in the Z-direction, wherein the P-type memory cell further comprises:

ninth channel layers spaced apart from each other in the Z-direction; and tenth channel layers spaced apart from each other in the Z-direction, wherein the OTP memory device further comprises:

a first following gate structure extending in the Y-direction and wrapping around the seventh channel layers and the ninth channel layers; and a second following gate structure extending in the Y-direction and wrapping around the eighth channel layers and the tenth channel layers, wherein the first following gate structure and the second following gate structure are electrically connected with each other, wherein the anti-fuse gate structure is between the first following gate structure and the second following gate structure in the X-direction, wherein the seventh channel layers, the eighth channel layers, the ninth channel layers, and the tenth channel layers attach on the wall structure.

9. The OTP memory device as claimed in claim 8, wherein the N-type memory cell further comprises:

eleventh channel layers spaced apart from each other in the Z-direction; and twelfth channel layers spaced apart from each other in the Z-direction, wherein the P-type memory cell further comprises:

thirteenth channel layers spaced apart from each other in the Z-direction; and fourteenth channel layers spaced apart from each other in the Z-direction, wherein the OTP memory device further comprises a third word-line gate structure extending in the Y-direction and wrapping around the eleventh channel layers and the thirteenth channel layers; and a fourth word-line gate structure extending in the Y-direction and wrapping around the twelfth channel layers and the fourteenth channel layers, wherein the third word-line gate structure and the fourth word-line gate structure are electrically connected with each other, wherein the anti-fuse gate structure is between the third word-line gate structure and the fourth word-line gate structure in the X-direction, wherein the eleventh channel layers, the twelfth channel layers, the thirteenth channel layers, and the fourteenth channel layers attach on the wall structure.

10. A one-time-programmable (OTP) memory device, comprising:

a memory array, comprising:

an N-type memory cell in a first row, wherein the N-type memory cell comprises:

a first active area extending in an X-direction;

an anti-fuse gate structure extending in a Y-direction and engaging the first active area; and a first word-line gate structure and a second word-line gate structure extending in the Y-direction and engaging the first active area;

a P-type memory cell in a second row, wherein the P-type memory cell comprises:

a second active area extending in the X-direction;

the anti-fuse gate structure extending in the Y-direction and engaging the second active area; and the first word-line gate structure and the second word-line gate engaging the second active area; and a wall structure extending in the X-direction, wherein the first active area and the second active area are disposed on opposite sides of the wall structure, wherein the first word-line gate structure and the second word-line gate structure are disposed on opposite sides of the anti-fuse gate structure, wherein the first word-line gate structure and the second word-line gate structure are electrically connected with each other, wherein in a programming operation, a turn-on voltage is applied to the first word-line gate structure and the second word-line gate structure, a program voltage is applied to the anti-fuse gate structure, such that the N-type memory cell is in a low-impedance storage state and the P-type memory cell is in a high-impedance storage state.

11. The OTP memory device as claimed in claim 10, wherein the N-type memory cell further comprises:

a first following gate structure and a second following gate structure extending in the Y-direction and engaging the first active area, wherein the P-type memory cell further comprises:

the first following gate structure and the second following gate structure engaging the second active area, wherein the first following gate structure and the second following gate structure are disposed on opposite sides of the anti-fuse gate structure, wherein the first following gate structure and the second following gate structure are electrically connected with each other.

12. The OTP memory device as claimed in claim 11, wherein the N-type memory cell further comprises:

a third word-line gate structure and a fourth word-line gate structure extending in the Y-direction and engaging the first active area, wherein the P-type memory cell further comprises:

the third word-line gate structure and the fourth word-line gate structure engaging the second active area, wherein the third word-line gate structure and the fourth word-line gate structure are disposed on opposite sides of the anti-fuse gate structure, wherein the third word-line gate structure and the fourth word-line gate structure are electrically connected with each other.

13. The OTP memory device as claimed in claim 10, further comprising:

source/drain contacts disposed on source/drain regions of the first active area and the second active area, wherein the source/drain contacts are disposed adjacent to the first word-line gate structure and the second word-line gate structure.

\* \* \* \* \*